United States Patent
Chiou et al.

(10) Patent No.: US 12,183,801 B2
(45) Date of Patent: Dec. 31, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Jin-Yan Chiou, Tainan (TW); Wei-Chuan Tsai, Changhua County (TW); Yen-Tsai Yi, Tainan (TW); Hsiang-Wen Ke, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 128 days.

(21) Appl. No.: 17/510,394

(22) Filed: Oct. 26, 2021

(65) Prior Publication Data

US 2023/0094638 A1    Mar. 30, 2023

(30) Foreign Application Priority Data

Sep. 27, 2021 (CN) .......................... 202111134660.5

(51) Int. Cl.
*H01L 29/45* (2006.01)
*H01L 29/40* (2006.01)

(52) U.S. Cl.
CPC .......... *H01L 29/456* (2013.01); *H01L 29/401* (2013.01)

(58) Field of Classification Search
CPC ..... H01L 29/456; H01L 29/401; H01L 29/45; H01L 29/165; H01L 29/66545; H01L 29/66575; H01L 21/28518; H01L 29/78; H01L 29/785; H01L 21/28556; H01L 23/485; H01L 21/2855; H01L 21/76855; H01L 21/76843; H01L 29/66795
See application file for complete search history.

(56) References Cited

U.S. PATENT DOCUMENTS

| | | | |
|---|---|---|---|
| 2017/0243760 A1* | 8/2017 | Chao | H01L 21/28518 |
| 2018/0061956 A1* | 3/2018 | Adusumilli | H01L 29/456 |
| 2018/0374749 A1* | 12/2018 | Wong | H01L 21/76876 |
| 2020/0091011 A1* | 3/2020 | Khaderbad | H01L 21/823871 |
| 2020/0176574 A1* | 6/2020 | Huang | H01L 29/41725 |
| 2022/0230925 A1* | 7/2022 | More | H01L 21/823871 |

\* cited by examiner

*Primary Examiner* — Shahed Ahmed
*Assistant Examiner* — Khatib A Rahman
(74) *Attorney, Agent, or Firm* — Winston Hsu

(57) ABSTRACT

A method for fabricating semiconductor device includes the steps of first forming a gate structure on a substrate, forming a source/drain region adjacent to two sides of the gate structure, forming an epitaxial layer on the source/drain region, forming an interlayer dielectric (ILD) layer on the gate structure, forming a contact hole in the ILD layer to expose the epitaxial layer, forming a low stress metal layer in the contact hole, forming a barrier layer on the low stress metal layer, and forming an anneal process to form a first silicide layer and a second silicide layer.

7 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming two silicide layers in contact holes adjacent to two sides of a gate structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

However, high contact resistance observed during the fabrication of contact plugs has become a common problem in current FinFET process thereby affecting the performance of the device substantially. Hence, how to improve the current process to resolve this issue has become an important task in this field.

SUMMARY OF THE INVENTION

According to an embodiment of the present invention, a method for fabricating semiconductor device includes the steps of first forming a gate structure on a substrate, forming a source/drain region adjacent to two sides of the gate structure, forming an epitaxial layer on the source/drain region, forming an interlayer dielectric (ILD) layer on the gate structure, forming a contact hole in the ILD layer to expose the epitaxial layer, forming a low stress metal layer in the contact hole, forming a barrier layer on the low stress metal layer, and forming an anneal process to form a first silicide layer and a second silicide layer.

According to another aspect of the present invention, a semiconductor device includes a gate structure on a substrate, a source/drain region adjacent to two sides of the gate structure, and a contact plug adjacent to the gate structure and on the source/drain region. Preferably, the contact plug includes a first silicide layer on the source/drain region and a second silicide layer on the first silicide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
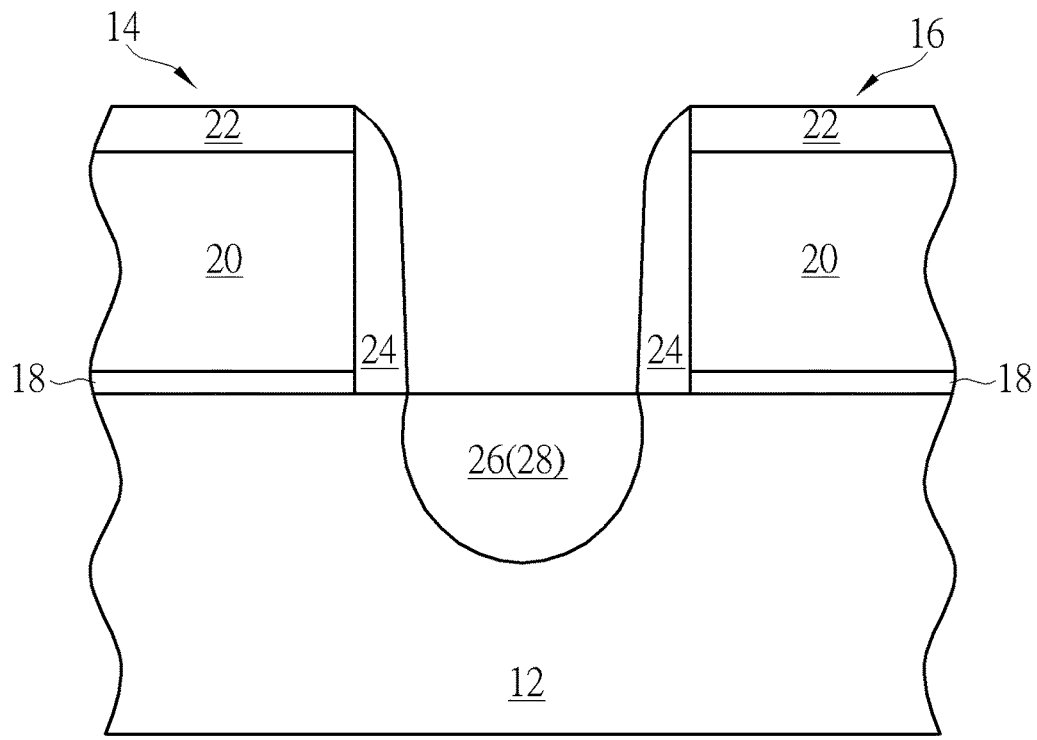
FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, a substrate 12 is provided, and gate structures 14, 16 are formed on the substrate 12. In this embodiment, the formation of the gate structures 14, 16 could be accomplished by sequentially forming a gate dielectric layer, a gate material layer, and a hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms gate structures 14 and 16 composed of patterned gate dielectric layer 18, patterned gate material layer 20, and patterned hard mask 22.

It should be noted that even though two gate structures 14, 16 are disclosed in this embodiment, the quantity or number of the gate structures 14, 16 is not limited to two, but could all be adjusted according to the demand of the product. Moreover, only part of the gate structures 14, 16, such as the right portion of the gate structure 14 and left portion of the gate structure 16 are shown in FIG. 1 to emphasize the formation of contact plug between gate structures 14, 16 in later process.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material; the gate material layer 20 could include metal, polysilicon, or silicide; the material of hard mask 22 could be selected from the group consisting of $SiO_2$, SiN, SiC, and SiON.

Moreover, according to an embodiment of the present invention, a plurality of doped wells or shallow trench isolations (STIs) could be selectively formed in the substrate 12. Despite the present invention pertains to a planar MOS transistor, it would also be desirable to apply the process of the present invention to non-planar transistors such as FinFET devices, and in such instance, the substrate 12 shown in FIG. 1 would become a fin-shaped structure formed atop a substrate 12.

Next, at least a spacer 24 is formed on the sidewalls of the gate structures 14, 16, a source/drain region 26 and/or epitaxial layer 28 is formed in the substrate 12 adjacent to two sides of the spacer 24. In this embodiment, the spacer 24 could be a single spacer or a composite spacer, such as a spacer including but not limited to for example an offset spacer (not shown) and a main spacer (not shown). Preferably, the spacer 24 is made of silicon nitride, but could also include other materials including but not limited to for example $SiO_2$, SiON, SiCN, or combination thereof. The source/drain region 26 and the epitaxial layer 28 could include different dopants and/or different materials depending on the type of transistor being fabricated. For instance, the source/drain region 26 could include n-type dopants or p-type dopants depending on the type of device being fabricated.

Figure 2:
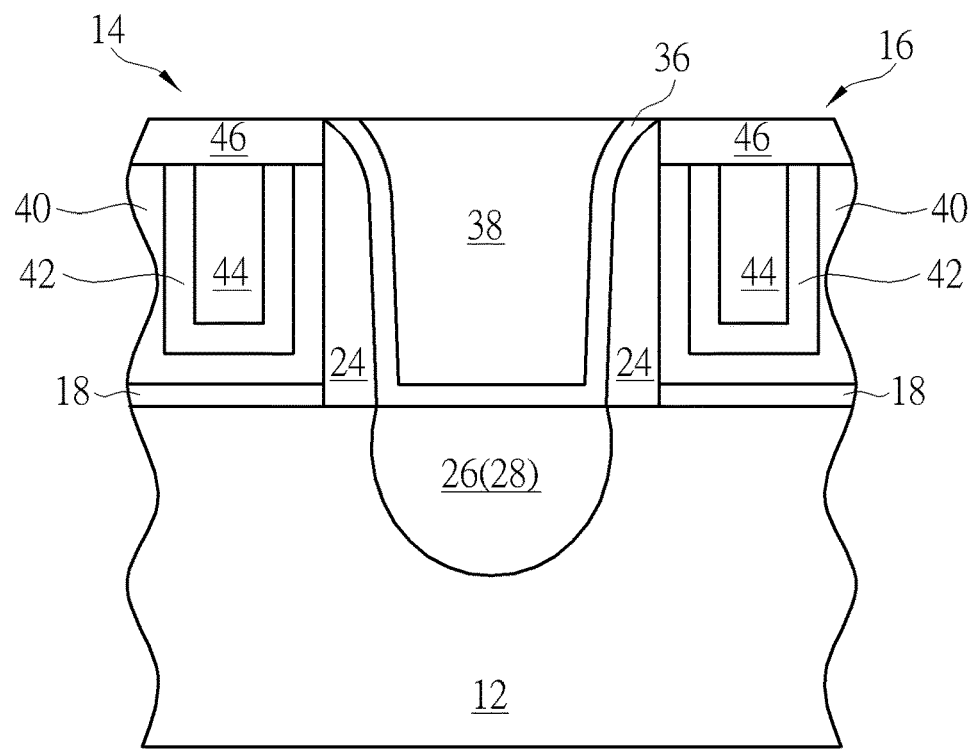

Next, as shown in FIG. 2, a contact etch stop layer (CESL) 36 made of silicon nitride could be formed on the substrate 12 to cover the gate structures 14, 16, and an interlayer dielectric (ILD) layer 38 is formed on the CESL 36. Next, a planarizing process, such as chemical mechanical polishing (CMP) process is conducted to remove part of the ILD layer 38 and part of the CESL 36 so that the top surfaces of the hard mask 22 and ILD layer 38 are coplanar.

Next, a replacement metal gate (RMG) process is conducted to transform the gate structures 14, 16 into metal gates. The RMG process could be accomplished by first performing a selective dry etching or wet etching process, such as using etchants including ammonium hydroxide ($NH_4OH$) or tetramethylammonium hydroxide (TMAH) to remove the hard masks 22 and gate material layer 20 from gate structures 14, 16 for forming recesses (not shown) in the ILD layer 38. Next, a high-k dielectric layer 40 and a conductive layer including at least a work function metal layer 42 and a low resistance metal layer 44 are formed in the recesses, and a planarizing process is conducted so that the surfaces of the U-shaped high-k dielectric layer 40, U-shaped work function metal layer 42, low resistance metal layer 44, and ILD layer 38 are coplanar.

In this embodiment, the high-k dielectric layer 40 is preferably selected from dielectric materials having dielectric constant (k value) larger than 4. For instance, the high-k dielectric layer 40 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 42 is formed for tuning the work function of the later formed metal gates to be appropriate in an NMOS or a PMOS. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 42 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low-resistance metal layer 44 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 40, part of the work function metal layer 42, and part of the low resistance metal layer 44 are removed to form recesses (not shown), and hard masks 46 are formed in the recesses so that the top surfaces of the hard masks 46 and ILD layer 38 are coplanar. The hard masks 46 could be selected from the group consisting of silicon oxide, silicon nitride, silicon oxynitride, and silicon carbon nitride.

Figure 3:
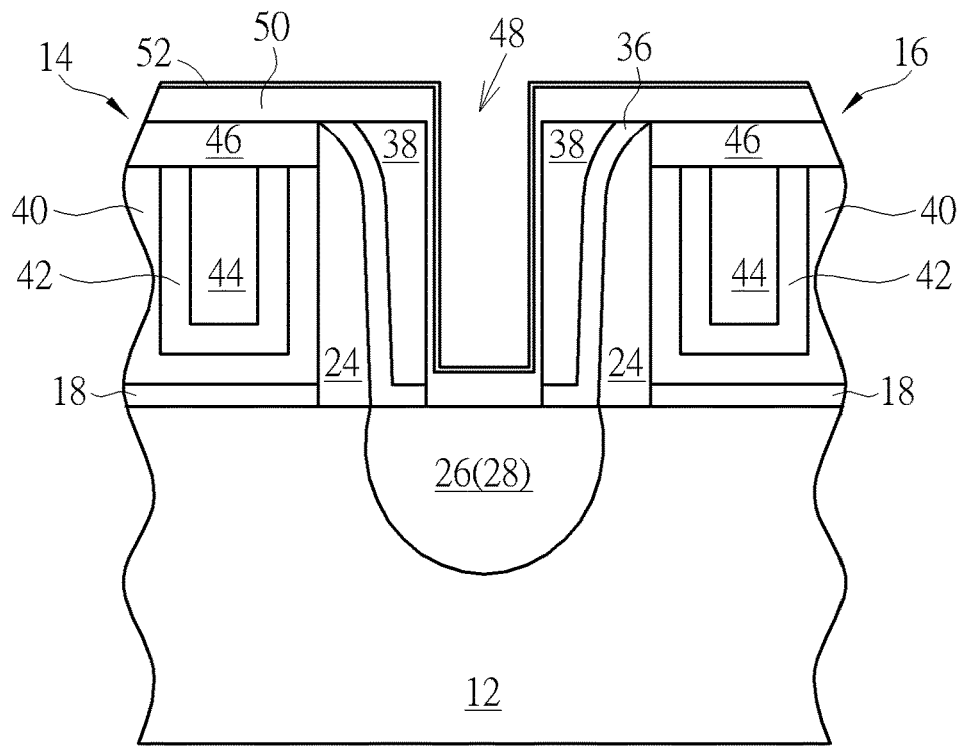

Next, as shown in FIG. 3, an etching process could be conducted by using a patterned mask (not shown) as mask to remove part of the ILD layer 38 and part of the CESL 36 adjacent to the gate structures 14, 16 to form contact holes 48 exposing the surface of the epitaxial layer 28, and a low stress metal layer 50 and a barrier layer 52 are formed in the contact holes 48 without filling the holes completely.

In this embodiment, the formation of the low stress metal layer 50 is preferably accomplished by a physical vapor deposition (PVD) process while the formation of the barrier layer 52 is accomplished by a chemical vapor deposition (CVD) process, in which parameters for forming the low stress metal layer 50 such as the DC power is about 1000 Watts, the RF power is about 4500 Watts, and an automatic capacitance (ACT) tuner position is about 75%. Typically, the ACT tuner position refers to a variable capacitor under ESD circuit for plasma bombardment strength control and in contrast to ACT tuner position is often controlled at 10% in conventional art for generating −712 MPa of high stress metal layer, the present invention preferably adjusts the ACT tuner position to 70% to 80% or most preferably at 75% so that a low stress metal layer 50 having stress between −330 MPa to −270 MPa or most preferably −299 MPa could be produced. Moreover, despite the low stress metal layer 50 in this embodiment preferably includes titanium (Ti), the low stress metal layer 50 could also be selected from the group consisting of titanium, cobalt, nickel, and platinum. The barrier layer 52 on the other hand could include metal nitride such as titanium nitride (TiN) or tantalum nitride (TaN) and most preferably include TiN.

Figure 4:
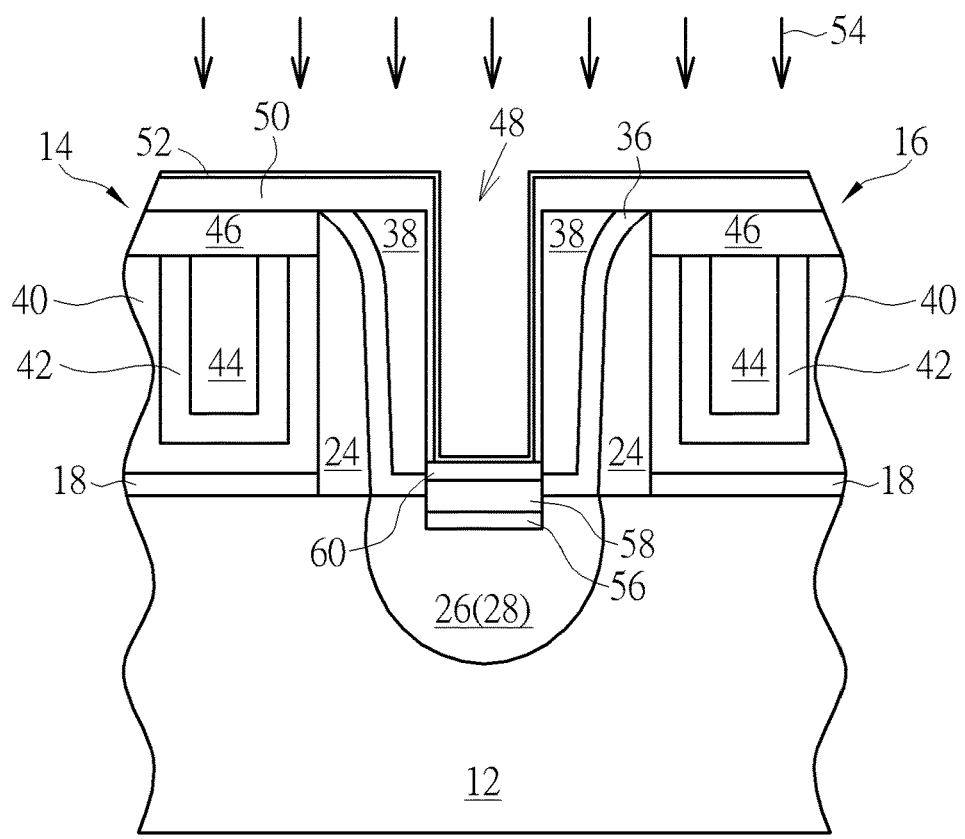

Next, as shown in FIG. 4, an anneal process 54 is conducted to form a plurality of silicide layers. Specifically, after depositing the low stress metal layer 50 and barrier layer 52, the anneal process 54 conducted at this stage could be accomplished by sequentially conducting a first thermal treatment process and a second thermal treatment process to form a plurality of silicide layers on the epitaxial layer 28. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

It should be noted that after the anneal process 54 is conducted the epitaxial layer 28 preferably reacts with the low stress metal layer 50 to form an interface layer 56, a silicide layer 58, and another silicide layer 60 from bottom to top between the epitaxial layer 28 and the un-reacted barrier layer 52. Preferably, the interface layer 56 includes silicon germanium (SiGe), the silicide layer 58 includes a metal germanosilicide or more specifically titanium germanosilicide (TiSiGe), and the silicide layer 60 includes a metal silicide or more specifically titanium silicide (TiSi).

Figure 5:
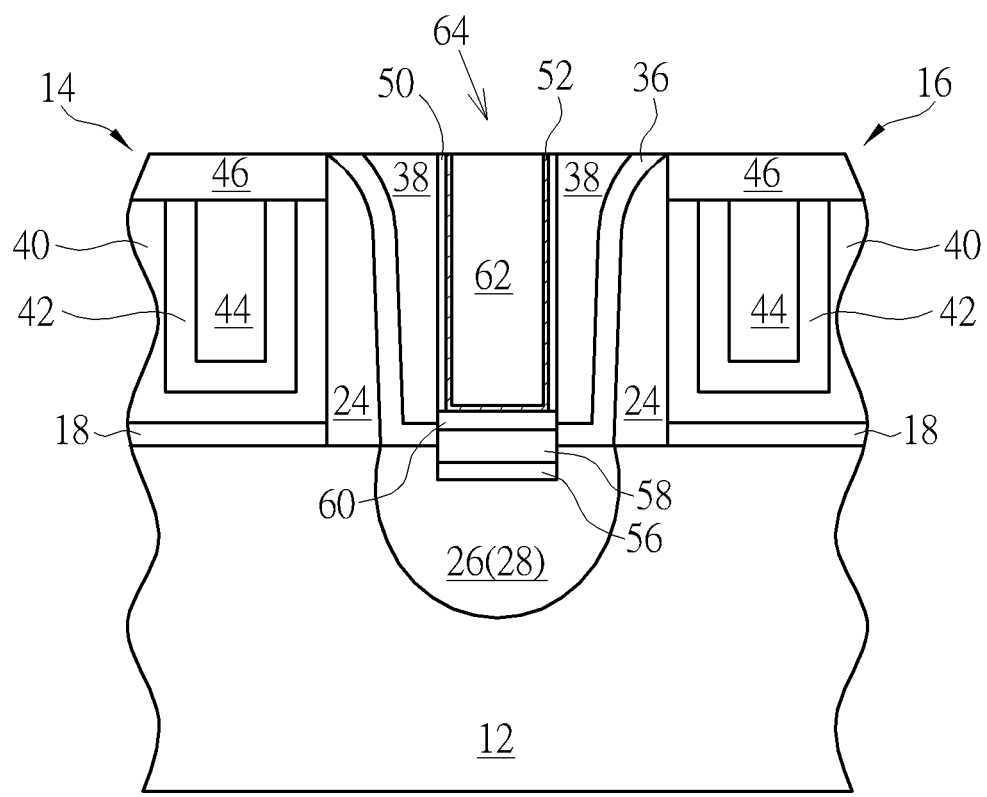

Next, as shown in FIG. 5, a conductive layer 62 is formed in the contact holes 48 to fill the holes completely. In this embodiment, the conductive layer 62 preferably includes tungsten (W), but not limited thereto. Next, a planarizing process such as CMP is conducted to remove part of the conductive layer 62, part of the barrier layer 52, part of the low stress metal layer 50, and even part of the ILD layer 38 depending on the demand of the process to form contact plugs 64 electrically connecting the epitaxial layer 28 adjacent to two sides of the gate structures 14, 16. This completes the fabrication of a semiconductor device according to an embodiment of the present invention.

Figure 6:
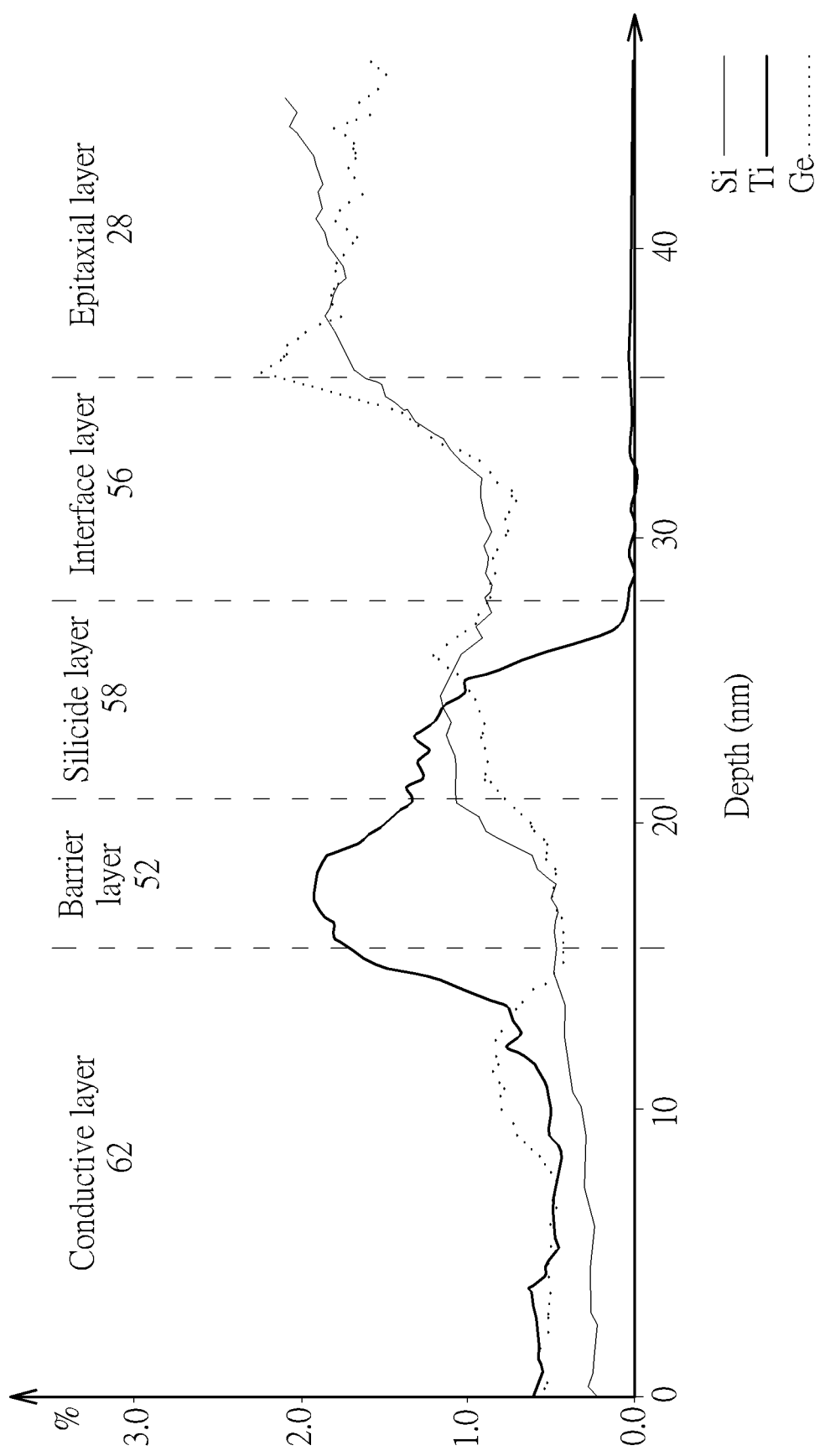

Referring to FIG. 6, FIG. 6 illustrates a distribution of elements including titanium (Ti) atoms, silicon (Si) atoms, and germanium (Ge) atoms within different material layers in the contact plug 64 according to an embodiment of the present invention, in which the X-axis indicates a relative depth of each material layer within the contact plug 64 while the Y-axis indicates a concentration of each element in the contact plug 64. As shown in FIG. 6, the concentration of germanium atoms within the contact plug 64 preferably decreases from the epitaxial layer 28 to the interface layer 56, increases slightly in the silicide layer 58 made of TiSiGe, and then decreases once more in the barrier layer 52 made of TiSi. In this embodiment, the Ge concentration in the epitaxial layer 28 is preferably between 25% to 45% or most preferably between 48% to 58%, the Ge concentration in the interface layer 56 is preferably between 17% to 23%, and the Ge concentration in the silicide layer 58 is preferably between 24% to 29%. Moreover, the thickness of the interface layer 56 is preferably between 10-20 Angstroms, the thickness of the silicide layer 58 is about 50 Angstroms, and the thickness of the silicide layer 60 could be less than, equal to, or greater than the thickness of the silicide layer 58.

It should be noted that even though an additional silicide layer 60 made of TiSi is disposed between the silicide layer 58 made of TiSiGe and the barrier layer 52 made of TiN or more specifically two silicide layers 58, 60 are disposed between the barrier layer 52 and the interface layer 56, according to other embodiment of the present invention it would also be desirable to slightly adjust the parameters of the process during the deposition of the low stress metal layer 50 and the anneal process 54 so that no additional silicide layer made of TiSi is formed. In this instance, the silicide layer 58 made of TiSiGe would be directly contacting the barrier layer 52 made of TiN on the top, which is also within the scope of the present invention. It should also be noted that to more clearly indicate the change in Ge concentration between the interface layer 56 and the silicide layer 58 made of TiSiGe, the silicide layer 60 made of TiSi between the silicide layer 58 and the barrier layer 52 is omitted in FIG. 6.

Overall, the present invention first forms contact holes adjacent to two sides of the metal gate, forms a low stress metal layer and a barrier layer in the contact holes, and then conduct an anneal process to react the low stress metal layer with the epitaxial layer for forming an interface layer 56, a silicide layer 58 made of TiSiGe, and a silicide layer 60 made of TiSi. Preferably, by adjusting various parameters in a PVD process, the present invention is able to form a low stress metal layer made of Ti and this metal layer having low stress could further facilitate Ge atoms to diffuse into the silicide layer 58 made of TiSiGe thereby reducing contact resistance of the contact plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate structure on a substrate;
   a source/drain region adjacent to two sides of the gate structure;
   a contact plug adjacent to the gate structure and on the source/drain region, wherein the contact plug comprises:
   an epitaxial layer on the source/drain region;
   an interface layer on the epitaxial layer, wherein the interface layer comprises silicon germanium;
   a first silicide layer on the interface layer;
   a second silicide layer on the first silicide layer, wherein both the first silicide layer and the second silicide layer comprise an I-shape;
   a barrier layer on the second silicide layer; and
   a conductive layer on the barrier layer.

2. The semiconductor device of claim 1, wherein a concentration of germanium in the interface layer is less than a concentration of germanium in the first silicide layer.

3. The semiconductor device of claim 1, wherein a concentration of germanium in the interface layer is less than a concentration of germanium in the epitaxial layer.

4. The semiconductor device of claim 1, wherein the barrier layer comprises titanium nitride (TiN).

5. The semiconductor device of claim 1, wherein the conductive layer comprises tungsten (W).

6. The semiconductor device of claim 1, wherein the first silicide layer comprises a metal germanosilicide.

7. The semiconductor device of claim 1, wherein the second silicide layer comprises a metal silicide.

* * * * *